United States Patent
Chang et al.

[11] Patent Number: 6,136,663
[45] Date of Patent: Oct. 24, 2000

[54] METHOD OF ETCHING SILICON NITRIDE

[75] Inventors: Yi-Chun Chang, Chung-Li; Ming-Sheng Kuo, Hsinchu, both of Taiwan

[73] Assignee: United Microelectronics Corp., Hsin-Chu, Taiwan

[21] Appl. No.: 09/074,894

[22] Filed: May 8, 1998

[30] Foreign Application Priority Data

Mar. 9, 1998 [TW] Taiwan ................... 87103397

[51] Int. Cl.[7] ................... H01L 21/76
[52] U.S. Cl. ................... 438/424; 438/724; 438/706; 438/712
[58] Field of Search ................... 438/424, 724, 438/706, 712

[56] References Cited

U.S. PATENT DOCUMENTS

| | | | |
|---|---|---|---|
| 4,857,140 | 8/1989 | Loewenstein | 156/643 |
| 5,269,879 | 12/1993 | Rhoades et al. | 156/643 |
| 5,843,846 | 12/1998 | Nguyen et al. | 438/713 |
| 5,933,759 | 8/1999 | Nguyen et al. | 438/700 |
| 5,942,446 | 8/1999 | Chen et al. | 438/734 |

FOREIGN PATENT DOCUMENTS

| | | |
|---|---|---|
| 0 763 850 A1 | 3/1997 | European Pat. Off. |
| 0 805 485 A2 | 11/1997 | European Pat. Off. |

*Primary Examiner*—Trung Dang

[57] ABSTRACT

A method of etching a silicon nitride layer. On a semiconductor substrate having a silicon nitride layer and a photo-resist layer on the silicon nitride layer formed thereon, the silicon nitride layer is removed by anisotropic plasma etching with the photo-resist layer as a mask. A mixture of tetra-fluoro-methane, argon, and nitrogen is used as an etching reactive material.

11 Claims, 3 Drawing Sheets

METHOD OF ETCHING SILICON NITRIDE

CROSS-REFERENCE TO RELATED APPLICATION

This application claims the priority benefit of Taiwan application serial no. 87103397, filed Mar. 9, 1998, the full disclosure of which is incorporated herein by reference.

BACKGROUND OF THE INVENTION

1. Field of the Invention

The invention relates to an etching method in an integrated circuit (IC), and more particularly to a method of etching the cap silicon nitride layer (Cap-SiN) on a poly-silicon gate or a mask silicon nitride layer for fabricating a shallow trench isolation (STI), so that the bias of the critical dimension (CD) is improved.

2. Description of the Related Art

Referring to FIG. 1, a conventional poly-silicon gate is shown. On a semiconductor substrate 100, a poly-gate comprises a gate oxide layer 101, a poly-silicon layer 102, a metal silicide layer 103, for example, a tungsten silicide (WSi) due to the very poor conductivity of poly-silicon, and a cap silicon nitride layer 104. The cap silicon nitride layer 104 is formed to prevent the damage of the poly-gate in the subsequent process, for example, damage caused during the formation of a source/drain region or self-aligned window, In addition, with the formation of the cap silicon nitride layer, the necking effect caused by subsequent exposure process during photolithography is prevented. In a conventional process of patterning the silicon nitride layer, a silicon nitride layer is formed first. Using a photo-mask, a photo-resist layer is formed on the silicon nitride layer. The exposed silicon nitride layer is then removed by anisotropic plasma etching. In the conventional method, fluoro-methane polymer ($CF_x$) are in use, for example, tri-fluoro-methane ($CHF_3$)/tetra-fluoro-methane ($CF_4$)/argon(Ar). The flow rate of the tri-fluoro-methane and the tetra-fluoro-methane are about 30 sccm to 70 sccm, and the flow rate of the argon is about 400 sccm to 800 sccm. Since the particle of fluoro-methane polymer is very large, the etched surface is very rough and ragged. Therefore, a large CD bias is produced. In the subsequent process, for example, in the subsequent photo-lithography, a serious misalignment or an error during exposure is easily caused due to a large CD bias, so that the device reliability is decreased, and the production quality is degraded.

On the other hand, while forming a shallow trench isolation, a similar problem occurs. Referring to FIG. 2a, on a semiconductor substrate 200, a mask silicon nitride layer 201 is formed. A photo-resist layer 202 is formed on the mask silicon nitride layer 201. Using photo-lithography and etching, the photo-resist layer 202 is defined as shown as 202a in FIG. 2a.

Referring to FIG. 2b, using anisotropic plasma etching, the exposed silicon nitride layer 201. In the conventional method, fluoro-methane polymer ($CF_x$) are in use, for example, tri-fluoro-methane ($CHF_3$)/tetra-fluoro-methane ($CF_4$)/argon(Ar). The flow rate of the tri-fluoro-methane and the tetra-fluoro-methane are about 30 sccm to 70 sccm, and the flow rate of the argon is about 400 sccm to 800 sccm. Since the particle of fluoro-methane polymer is very large, the etched surface is very rough and ragged. Therefore, a large CD bias is produced. The resultant silicon nitride layer 201a is shown as figure. In addition, during etching, a fluoride layer is formed. The formation of the fluoride cause the difficulty of forming a gate oxide layer in the subsequent process. Using a conventional method, a part of the semiconductor substrate 200 is removed, so that a trench is formed within the substrate 200. By filling the trench with an insulated material, for example, an oxide, an shallow trench isolation is formed.

SUMMARY OF THE INVENTION

It is therefore an object of the invention to provide a method of etching a silicon nitride layer. Using different etching reactive material, the CD bias is decreased. Consequently, the reliability of devices is enhanced, and the production quality is improved.

It is therefore another object of the invention to provide a method of etching a silicon nitride layer. Using different etching reactive material, the silicon nitride layer is etched with the formation of a fluoride layer, so that the formation of a gate oxide layer is affected.

It is a further object of the invention to provide a method of etching a silicon nitride layer. During the formation of a cap silicon nitride layer on a poly-gate, a thin polymer layer is formed on the cap silicon nitride layer simultaneously. The height of the poly-gate is increased, so that an interconnect, for example, a metal plug, is formed with a larger depth in the subsequent metallization process. With a larger depth, the surface area is increased, and therefore, the capacitance of the interconnect is increased. Consequently, a higher operation speed is obtained.

To achieve these objects and advantages, and in accordance with the purpose of the invention, as embodied and broadly described herein, the invention is directed towards a method of etching a silicon nitride layer. On a semiconductor substrate having a silicon nitride layer and a photo-resist layer on the silicon nitride layer formed thereon, the silicon nitride layer is removed by anisotropic plasma etching with the photo-resist layer as a mask. A mixture of tetra-fluoro-methane, argon, and nitrogen is used as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer.

To achieve these objects and advantages, and in accordance with the purpose of the invention, as embodied and broadly described herein, the invention is directed towards a method of fabricating a poly-gate. A semiconductor substrate having a gate oxide layer, a poly-silicon layer on the gate oxide layer, a metal silicide layer on the poly-silicon layer, a silicon nitride layer on the poly-silicon layer, and a photo-resist layer covering a part of the silicon nitride layer is provided. Using anisotropic plasma etching, the exposed silicon nitride layer is removed. A mixture of tetra-fluoro-methane, argon, and nitrogen is used as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer.

To achieve these objects and advantages, and in accordance with the purpose of the invention, as embodied and broadly described herein, the invention is directed towards a method of fabricating a shallow trench isolation. A semiconductor substrate having a silicon nitride thereon and a photo-resist layer covering a part of the silicon nitride layer is provided. The exposed silicon nitride layer is removed by anisotropic plasma etching until the semiconductor substrate is exposed. A mixture of tetra-fluoro-methane, argon, and nitrogen is used as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer. The photo-resist layer is removed. A part of the exposed semiconductor substrate is removed to form a trench. The trench is filled with an insulation material.

It is to be understood that both the foregoing general description and the following detailed description are exemplary and explanatory only and are not restrictive of the invention, as claimed.

DESCRIPTION OF THE PREFERRED EMBODIMENTS

Figure 1:
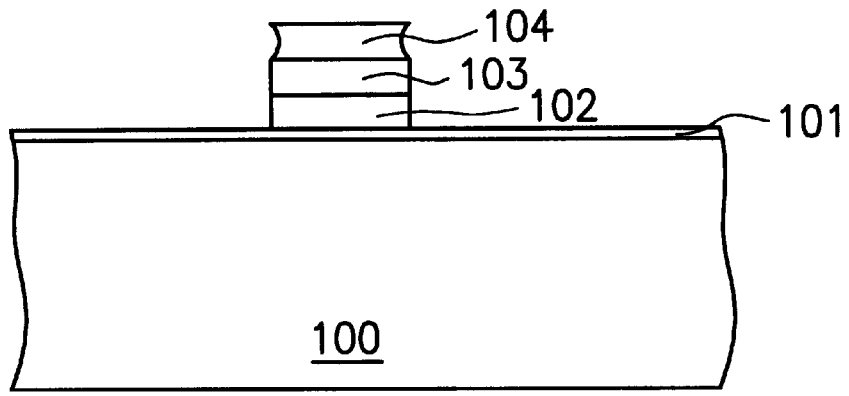
FIG. 1 shows a conventional fabricating process of a poly-gate.
Figure 2A:
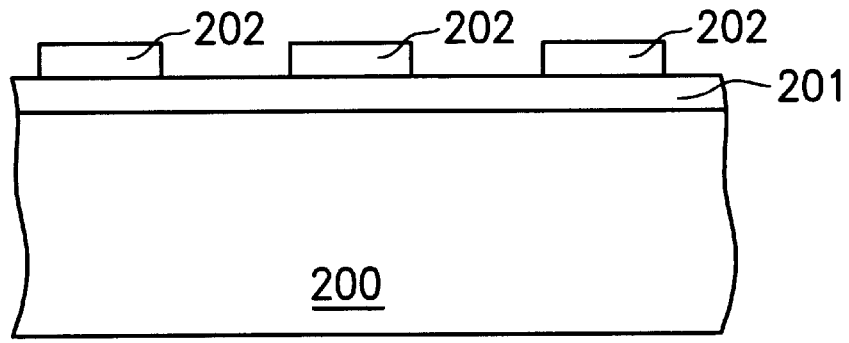
FIG. 2a to FIG. 2b show a conventional method of fabricating a shallow trench isolation.
Figure 2B:
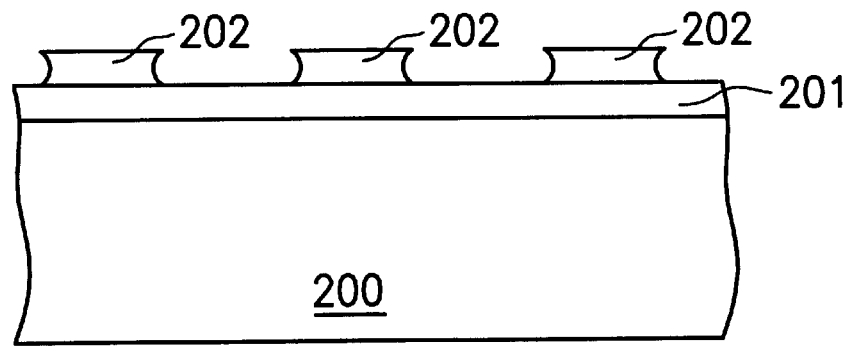
Figure 3A:
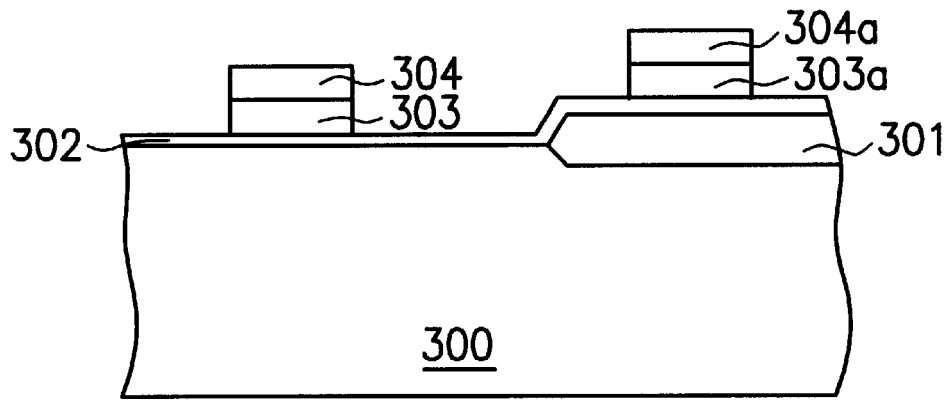
FIG. 3a to FIG. 3b show a method of fabricating a poly-gate in a preferred embodiment according to the invention.
Figure 3B:
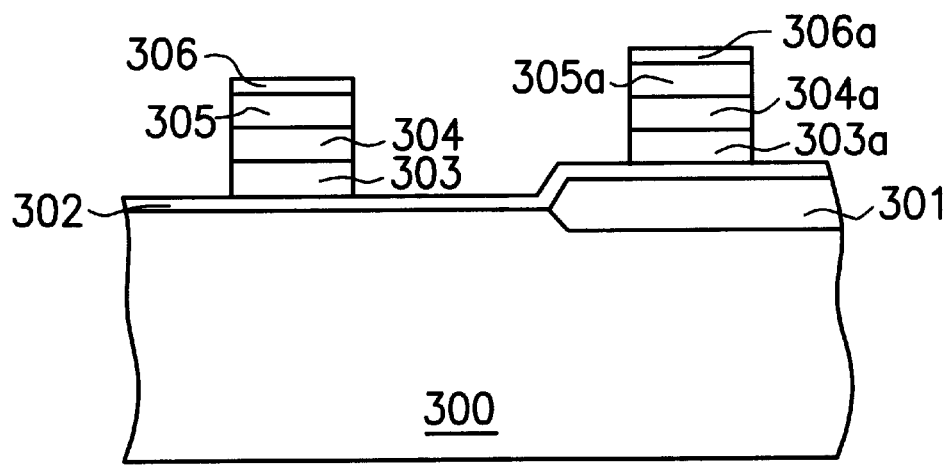

In FIG. 3a to FIG. 3b, a method of fabricating a poly-gate in the first preferred embodiment according to the invention is shown.

Referring to FIG. 3a, a semiconductor substrate 300 having a isolation structure 301, for example, a field oxide layer, a gate oxide layer 302 thereon, a first poly-silicon layer 303 and 303a on the gate oxide layer 302 and the isolation structure 301, respectively, and a metal silicide layer, for example, a tungsten silicide layer, 304 and 304a on the poly-silicon layer 303 and 303a, respectively is provided.

Referring FIG. 3b, over the semiconductor substrate 300, a silicon nitride layer is formed. A photo-resist layer (not shown) is defined and aligned with the poly-silicon layer 303 and 303a on the silicon nitride layer to cover a part of the silicon nitride layer. The exposed silicon nitride layer is removed by anisotropic plasma etching. A mixture of tetra-fluoro-methane, argon, and nitrogen is used as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer. As shown in the figure, after removing the photo-resist layer, on the metal silicide layer 304 and 304a, a cap silicon nitride layer 305, 305a and a polymer layer 306, 306a are formed sequentially.

By the above etching process, the CD bias of the silicon nitride layer is effectively improved. Moreover, a thin and hard polymer layer is formed on the silicon nitride layer. In the subsequent metallization process for forming an interconnect, for example, a metal plug, the depth of the interconnect is increased, so that the surface area is enlarged. Consequently, the capacitance is increased, and the operation speed of the device is enhanced.

Figure 4A:
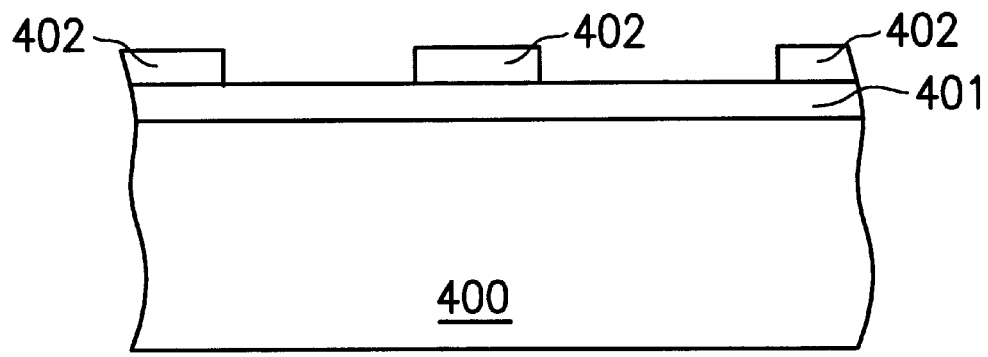
FIG. 4a to FIG. 4c show a method of fabricating a shallow trench isolation in a preferred embodiment according to the invention.
Figure 4B:
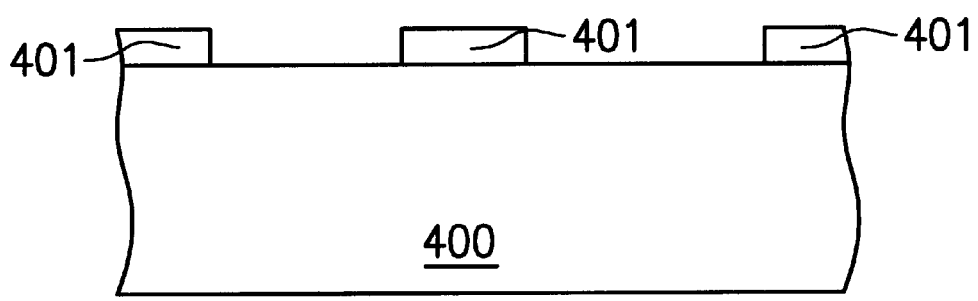
Figure 4C:
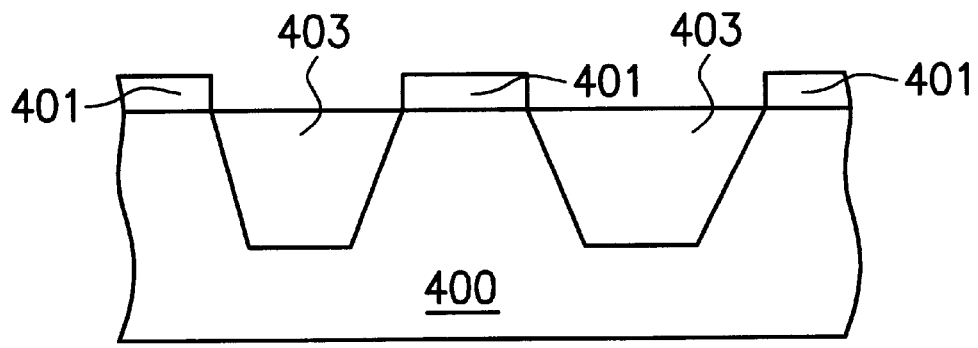

In FIG. 4a to FIG. 4c, a method of fabricating a shallow trench isolation in the second embodiment according to the invention is shown.

Referring to FIG. 4a, a semiconductor substrate 400 having a silicon nitride layer 401 thereon and a photo-resist layer 402 covering a part of the silicon nitride layer is provided. The semiconductor substrate 400 covered by the exposed silicon nitride layer 401 is a predetermined area for forming a shallow trench isolation.

Referring to FIG. 4b, the exposed silicon nitride layer is removed by anisotropic plasma etching until the semiconductor substrate is exposed. A mixture of tetra-fluoro-methane, argon, and nitrogen is used as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer. By the above etching reactive material, the formation of a fluoride layer is prevented, so that the formation of a gate oxide in the subsequent process is not affected. The photo-resist layer 402 is then removed, and the resultant structure is as shown in the figure.

Referring to FIG. 4c, using a conventional method, a part of the exposed semiconductor substrate 400 is removed to form a trench. By filling the trench with an insulation material, for example, oxide, a shallow trench 403 isolation is formed.

It is therefore a characteristic of the invention to provide an etching method with a mixture of tetra-fluoro-methane, argon, and nitrogen as an etching reactive material. The tetra-fluoro-methane with a flowing rate of about 40 sccm to 80 sccm is functioned to removed the exposed silicon nitride layer. The argon with a flowing rate of about 400 sccm to 800 sccm is used for particle bombardment. The nitrogen with a flowing rate of about 20 sccm to 60 sccm is to form a thin and hard polymer layer on the silicon nitride layer. Using the function of the etching reactive material, the CD bias of the silicon nitride layer is effectively improved. While fabricating a poly-gate, a thin polymer layer is formed on the cap silicon nitride layer to increase to depth of an interconnect formed subsequently. Thus, the capacitance of the interconnect is increased, and consequently, the operation speed of the device is enhanced. On the other hand, during the formation of a shallow trench isolation, using the etching reactive material in the invention, the formation of a fluoride layer is prevented. Therefore, the formation of a gate oxide layer in the subsequent process is not affected.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a poly-gate, wherein a semiconductor substrate having a gate oxide layer, a poly-silicon layer and a metal silicide layer defined on the gate oxide layer, a silicon nitride layer over the metal silicide layer, and a photo-resist layer covering a part of the silicon nitride layer is provided, comprising:

removing the exposing silicon nitride layer to remain the silicon nitride layer on the metal silicide layer only by using a mixture of tetra-fluoro-methane, argon and nitrogen as an etching reactive material, wherein a polymer layer is formed on the silicon nitride layer during etching the exposed silicon nitride layer; and removing the photo-resist layer.

2. The method according to claim 1, wherein the exposed silicon nitride layer is removed by ansiotropic plasma etching.

3. The method according to claim 1, further comprising forming a polymer layer on the silicon nitride layer.

4. The method according to claim 1, wherein:

the tetra-fluoro-methane has a flowing rate of about 40 sccm to 80 sccm;

the argon has a flowing rate of about 400 sccm to 800 sccm; and the nitrogen has a flowing rate of about 20 sccm to 60 sccm.

5. The method according to claim 4, wherein:

the function of the tetra-fluoro-methane is to removed the exposed silicon nitride layer;

the function of the argon is for particle bombardment; and the function of the nitrogen is to form a thin polymer layer on the silicon nitride layer.

6. A method of forming a poly-gate, wherein a semiconductor having a gate oxide layer, a poly-silicon layer and a metal silicide layer defined on the gate oxide layer, a silicon nitride layer on the metal silicide layer, and a photo-resist layer covering a part of the silicon nitride layer is provided, comprising:

removing the exposing silicon nitride layer by using anisotropic plasma etching with a mixture of tetra-fluoro-methane, argon, and nitrogen as an etching reactive material;

forming a thin polymer layer on the silicon nitride layer; and removing the photo-resist layer, wherein:

the tetra-fluoro-methane for removing the exposed silicon nitride layer having a flowing rate of about 40 sccm to 80 sccm;

the argon for particle bombardment having a flowing rate of about 400 sccm to 800 sccm; and the nitrogen forming a thin polymer layer on the silicon nitride layer having a flowing rate of about 20 sccm to 60 sccm.

7. A method of forming a shallow trench isolation, wherein a semiconductor substrate having a silicon nitride layer and a photo-resist layer covering a part of silicon nitride layer is provided, comprising:

removing the exposed silicon nitride layer by using a mixture of tetra-fluoro-methane, argon, and nitrogen as an etching reactive material until the semiconductor substrate is exposed without forming a fluoride layer thereon;

removing the photo-resist layer;

removing a part of the exposed semiconductor substrate to form a trench; and filling the trench with an insulation material.

8. The method according to claim 7, wherein the exposed silicon nitride layer is removed by ansiotropic plasma etching.

9. The method according to claim 7, wherein:

the tetra-fluoro-methane has a flowing rate of about 40 sccm to 80 sccm;

the argon has a flowing rate of about 400 sccm to 800 sccm; and the nitrogen has a flowing rate of about 20 sccm to 60 sccm.

10. The method according to claim 9, wherein:

the function of the tetra-fluoro-methane is to removed the exposed silicon nitride layer;

the function of the argon is for particle bombardment; and the function of the nitrogen is to form a thin polymer layer on the silicon nitride layer.

11. A method of forming a shallow trench isolation, wherein a semiconductor substrate having a silicon nitride layer and a photo-resist layer covering a part of the silicon nitride layer is provided, comprising:

removing the exposed silicon nitride layer by using anisotropic plasma etching with a mixture of tetra-fluoro-methane, argon, and nitrogen as an etching reactive material until the semiconductor substrate is exposed without forming a fluoride layer thereon;

removing the photo-resist layer;

removing a part of the exposed semiconductor substrate to form a trench; and filling the trench with an insulation material, wherein:

the tetra-fluoro-methane for removing the exposed silicon nitride layer having a flowing rate of about 40 sccm to 80 sccm;

the argon for particle bombardment having a flowing rate of about 400 sccm to 800 sccm; and the nitrogen forming a thin polymer layer on the silicon nitride layer having a flowing rate of about 20 sccm to 60 sccm.

* * * * *